(12) United States Patent
Okuda et al.

(10) Patent No.: US 6,471,836 B2
(45) Date of Patent: Oct. 29, 2002

(54) SPUTTERING APPARATUS

(75) Inventors: Akira Okuda, Sakai; Shigeru Namiki, Kadoma; Kiyoshi Saeki, Neyagawa; Toshiyuki Fujioka, Osaka, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/884,965

(22) Filed: Jun. 21, 2001

(65) Prior Publication Data
US 2001/0054551 A1 Dec. 27, 2001

(30) Foreign Application Priority Data
Jun. 23, 2000 (JP) .......................................... 2000-188901

(51) Int. Cl.⁷ .............................................. C23C 14/34
(52) U.S. Cl. .............................. 204/298.11; 204/298.12; 204/298.14
(58) Field of Search ....................... 204/298.12, 298.13, 204/298.11, 298.14

(56) References Cited

U.S. PATENT DOCUMENTS 4,946,576 A * 8/1990 Dietrich et al. ......... 204/298.06
5,690,795 A * 11/1997 Rosenstein et al. ..... 204/298.11

* cited by examiner

Primary Examiner—Rodney G. McDonald
(74) Attorney, Agent, or Firm—Parkhurst & Wendel, LLP

(57) ABSTRACT

During sputtering for use in thin film deposition, anomalous discharge is prevented from generating between a target and a backing plate, and a target presser. In the target presser also serving as an earth shield and a deposition preventing plate, an insulating member staying in contact with the sputtering target or the backing plate is provided with a recess constituted of two or more different depths so that the recess does not come in contact with the sputtering target or the backing plate.

5 Claims, 5 Drawing Sheets

SPUTTERING APPARATUS

FIELD OF THE INVENTION

The present invention relates to a sputtering apparatus for use in thin film deposition, in which generation of anomalous discharge between a target and a backing plate, and a target presser can be prevented.

BACKGROUND OF THE INVENTION

In recent years, a sputtering apparatus has been widely used in a thin film forming process for a semiconductor, a liquid crystal, an optical disk, an electronic device and the like. In particular, a sputtering apparatus for an optical disk or the like requires a remarkably reduced cost of equipment and a high throughput, and therefore, it must have a simple structure with ease of maintenance. Consequently, the equipment is simplified and the maintenance is facilitated with a structure in which an earth shield and a deposition preventing plate are integrated with each other and a target presser capable of fixing a target to a cathode is used.

Referring to FIG. 7, explanation will be made below on one example of a sputtering apparatus of a prior art. In FIG. 7, reference numeral 1 designates a sputtering target as a film forming material; and 2 denotes a backing plate comprised of copper or the like, for cooling the sputtering target 1. Reference numeral 3 designates a sputtering reactive chamber; and 4 denotes a cathode on which the sputtering target 1 and the backing plate 2 are placed. Reference numeral 5 designates a substrate holder disposed opposite to the cathode 4, for mounting thereon a substrate 6, on which a film is deposited by sputtering. Reference numeral 7 designates a power source for applying a voltage to the cathode 4 so as to generate plasma on the sputtering target 1; a vacuum exhaust pump 8 for vacuum exhausting the inside of the reactive chamber 3 into a pressure reduced atmosphere; a gas supply system 9 for supplying sputtering gas into the reactive chamber 3; a deposition preventing plate 10 comprised of stainless steel or the like and provided along the entire circumference between the substrate 6 and the backing plate 2, for preventing any deposition of sputtered particles onto the inner surface of the reactive chamber; and an insulating member 11 interposed between the deposition preventing plate 10 and the backing plate 2 and fixed to the deposition preventing plate 10 via screws or the like. The deposition preventing plate 10 and the insulating member 11 integrally serve as a target presser, which thus presses the backing plate 2, and as a result, fixes the sputtering target 1 to the cathode 4. Furthermore, reference numeral 13 designates a member for insulating the reactive chamber 3 from the cathode 4.

A description will be given below as to the operation of the sputtering apparatus and the sputtering target which are configured as described above. First, the vacuum exhaust pump 8 vacuum exhausts the inside of the reactive chamber 3 to a degree of vacuum of about $10^{-5}$ Pa. Next, the gas supply system 9 introduces argon gas into the reactive chamber 3 so as to regulate a pressure to a degree of vacuum of about 0.67 Pa. The power source 7 applies a DC voltage or a high-frequency voltage of about 1000 V so as to generate plasma inside the reactive chamber 3, thereby forming a sputtered film on the substrate 6. At this time, the insulating member 11 keeps insulation between the deposition preventing plate 10 and each of the sputtering target 1 and the backing plate 2. The deposition preventing plate 10 functions as an earth shield, so that the plasma is generated on the sputtering target 1. Moreover, sputtering particles sputtered to portions other than the substrate 6 are deposited on the deposition preventing plate 10.

However, with the above-described configuration, a film 12 is unfavorably deposited also on the side surface of the insulating member 11 of the target presser which is in contact with the sputtering target 1 or the backing plate 2, as shown in FIG. 8. Therefore, a long-term film deposition reduces insulation resistance between the target presser and each of the sputtering target 1 and the backing plate 2, thereby causing a phenomenon such as anomalous discharge like arc discharging, or no discharging, and further, inducing deposition of foreign matters on the substrate or a non-uniform film thickness. Consequently, it is important to achieve stable discharging in order to enhance the operability of equipment or the yield of a product.

The present invention has been accomplished in view of the above-described problems experienced in the prior art. Therefore, an object of the present invention is to provide a sputtering apparatus for use in a thin film deposition, in which the operability of equipment or the yield of a product can be enhanced by suppressing anomalous discharge occurring between a target and a backing plate, and a target presser.

SUMMARY OF THE INVENTION

In general, in a sputtering apparatus, sputtering particles ejected from a surface of a sputtering target inside a reactive chamber spatter substantially linearly. When the sputtered particles collide against the surface of an object, some of the collided particles bounce and keep on spattering. In consideration of the above-described bouncing and spattering, it seems that the sputtering particles spatter even at deeper portions off linear routes extending from the target but in a quite reduced amount. In view of this, a recess is formed at an insulating member in such a manner that an unfavorable deposition film is not continuously formed on the insulating member of a target presser by sputtering. In this way, a film is hardly formed inside the recess, thus preventing any decrease in sputtering particles caused by the above-described bouncing and spattering, reducing the amount of deposited particles per unit area since the total area of the inner surface of the recess is increased as compared with the case where no recess is formed, and further, reducing the amount of deposited particles since the inside of the recess is relatively remote from a target. The non-continuous state of the deposited film has been confirmed from an insulating member having a recess in a preferred embodiment.

A sputtering apparatus according to the present invention which has been invented in the above-described manner is featured in that in a target presser also serving as an earth shield and a deposition preventing plate, a recess, more preferably, a recess constituted of two or more steps having different depths is formed in an insulating member which is in contact with a target or a backing plate. According to the present invention, it is possible to suppress anomalous discharge between the target and backing plate and the target presser, so as to reduce the maintenance frequency of equipment and enhance the operability. Moreover, it is possible to reduce pinholes, deposition of foreign matters or the like so as to make discharging stable, thereby achieving a uniform film thickness and enhancing the yield of a product.

DESCRIPTION OF THE PREFERRED EMBODIMENTS

A mode for carrying out a, sputtering apparatus according to the present invention will be described below in reference to FIGS. 1 and 2.

Figure 1:
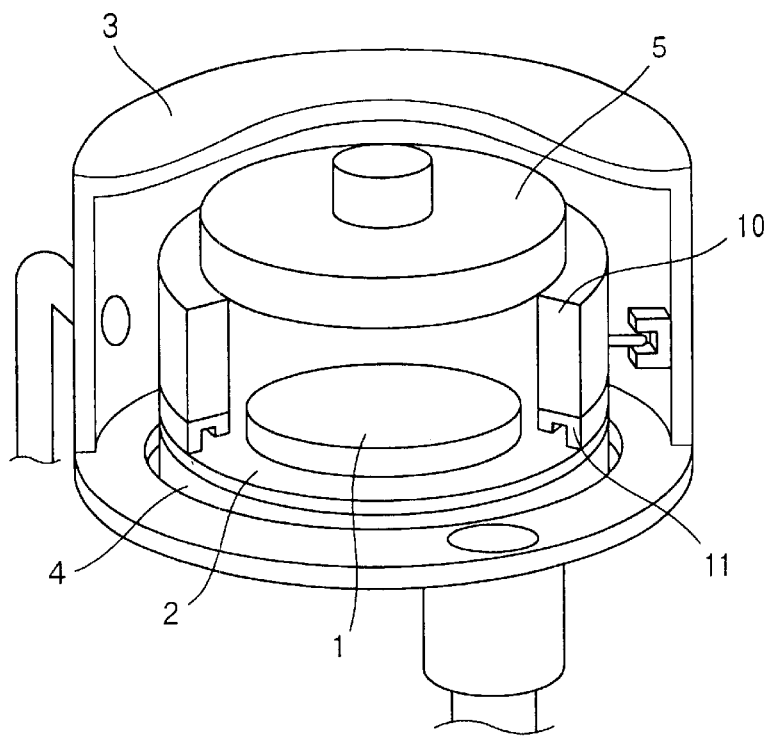
FIG. 1 is a perspective view showing the inside of a reactive chamber in a sputtering apparatus according to the present invention.
Figure 2:
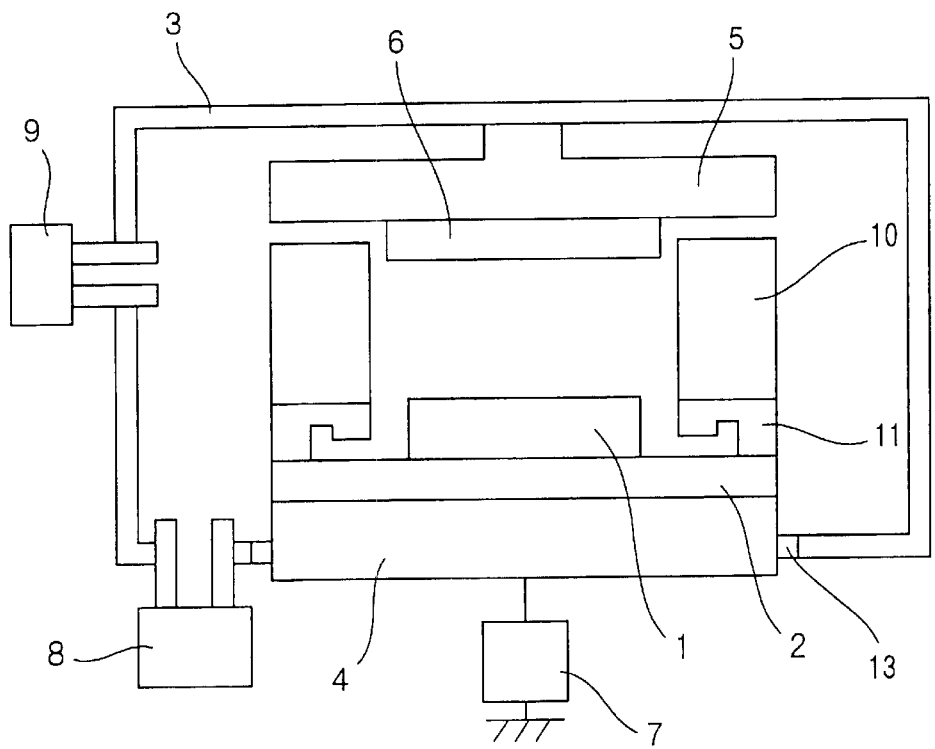
FIG. 2 is a schematic cross-sectional view showing the sputtering apparatus according to the present invention.
Figure 3:
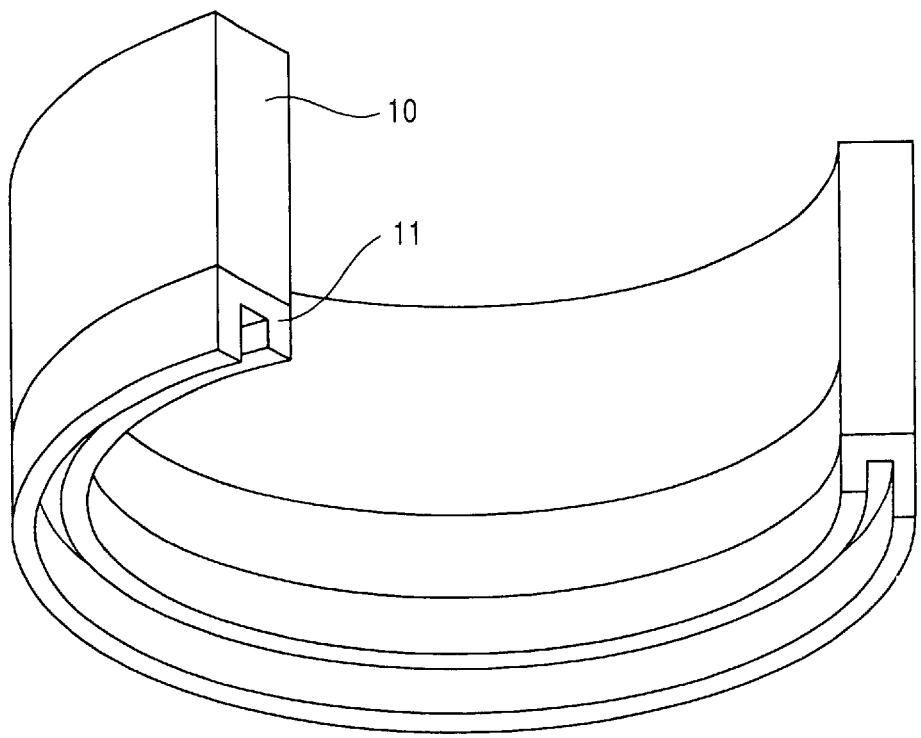
FIG. 3 is a perspective view showing a target presser in the sputtering apparatus according to the present invention.
Figure 4:
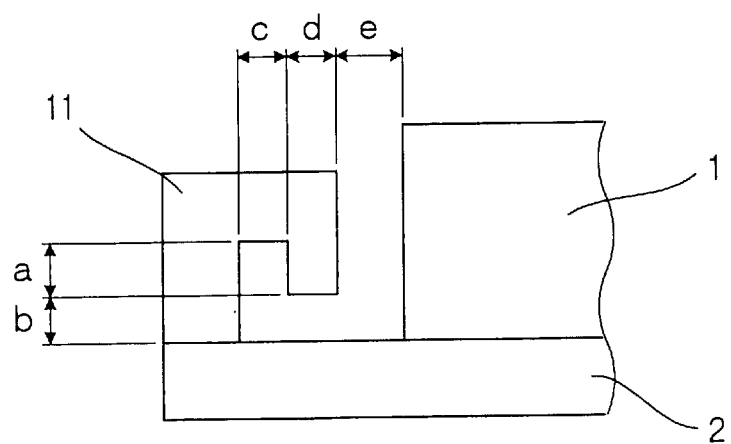
FIG. 4 is an enlarged cross-sectional view showing the target presser in the sputtering apparatus according to the present invention.

FIG. 1 is a perspective view showing the inside of a reactive chamber in a sputtering apparatus for use in thin film deposition; and FIG. 2 is a schematic cross-sectional view showing the reactive chamber, in which components outside the reactive chamber are schematically shown. FIGS. 3 and 4 are a perspective view and an enlarged cross-sectional view showing a target presser in the sputtering apparatus, respectively. The configuration is the same as that explained by way of the prior art, except for the shape of an insulating member 11 of the target presser, and therefore, is assisted by the explanation made of the prior art. In FIG. 4, reference numeral 1 designates a sputtering target, like in FIGS. 1 and 2; 2, a backing plate, like in FIGS. 1 and 2; and 11, the insulating member as a part of the target presser, like in FIGS. 1 and 2.

Here, the insulating member 11 comprised of Teflon is formed with a two-stepped recess cut from the side of the target, as shown in FIGS. 3 and 4, unlike that in the prior art. In FIG. 4, a distance (e) from the end surface of the sputtering target 1 to the inside end surface of the insulating member 11 is set in such a manner as to prevent any glow discharging or arc discharging even if a metallic film is deposited on the inside end surface of the insulating member 11. Specifically, it is desirable that the distance (e) should be approximately 2.2 mm±0.7 mm. In the mode carrying out the present invention, a first step recess (b) is formed in order to prevent any contact of a deposition preventing plate 10 with the backing plate 2, wherein a distance from the backing plate 2 to a surface facing the backing plate 2 is set in such a manner as to prevent any glow discharging or arc discharging even if a film intrudes to be deposited. Specifically, it is desirable that the distance should be 2.1 mm±1.1 mm. However, the film may be often deposited markedly by a sputtering pressure. In such case, the distance may be set to 0.5 mm. Moreover, a second-step recess (a) having a different depth is formed in order to prevent any short-circuiting with the backing plate 2 even if the film is deposited on the first-step recess (b) of the insulating member 11. Here, it is desirable that a distance from the first-step recess should be 0.5 mm or more in such a manner as to prevent any deposition of the film. Additionally, a distance (d) of the first-step recess of the insulating member 11 at a surface facing the backing plate 2 is desirably 2 mm or more such that no film is deposited at a surface (c) of the second-step recess facing the backing plate 2. In addition, a distance (c) of the second-step recess of the insulating member 11 at a surface facing the backing plate 2 is desirably 0.5 mm or more such that insulation can be completely maintained without any deposition of a film.

A description will be given of operation with the above-described configuration. First, a vacuum exhaust pump 8 vacuum exhausts the inside of a reactive chamber 3 to a degree of vacuum of about $10^{-5}$ Pa. Next, a gas supply system 9 introduces Argon gas into the reactive chamber 3 so as to regulate a pressure at a degree of vacuum of about 0.67 Pa. A power source 7 applies a DC voltage or a high-frequency voltage of about 1000 V so as to generate plasma inside the reactive chamber 3, thereby forming a sputtered film on a substrate 6. At this time, the insulating member 11 keeps insulation between the deposition preventing plate 10 and the sputtering target 1 and backing plate 2. The deposition preventing plate 10 functions as an earth shield, so that plasma is generated on the sputtering target 1. Moreover, sputtering particles spattered onto portions other than the substrate 6 are deposited on the deposition preventing plate 10.

Figure 5:
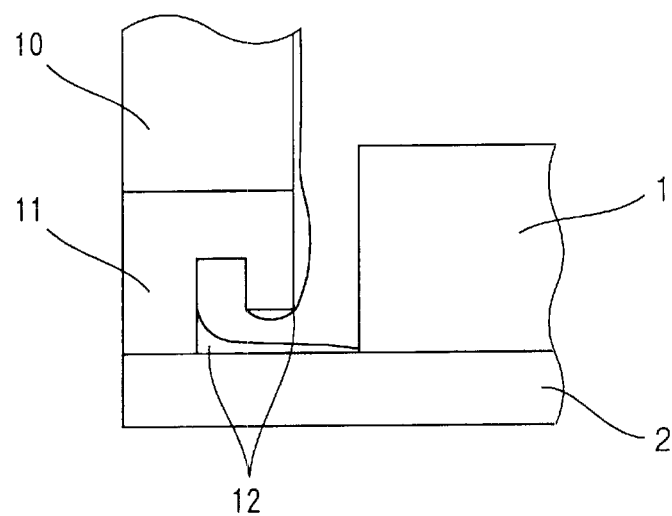
FIG. 5 is a view showing a film deposited on the target presser in the sputtering apparatus according to the present invention.

However, even if a film 12 is deposited on the insulating member 11 of the target presser in the case where sputtering is performed for a long period, as shown in FIG. 5, the formation of the recess in the insulating member 11 provides the distance (e) or (b) between the insulating member 11 and the sputtering target 1 or the backing plate 2, thereby preventing any contact and any short-circuiting. Furthermore, since there is only little deposit of the film 12 on the second-step recess of the insulating member 11, the film 12 is formed in a non-continuous fashion, thereby completely preventing any short-circuiting. Additionally, the distance between the insulating member 11 and the sputtering target 1 or the backing plate 2 is set in such a manner as to prevent any glow discharging or any arc discharging, so that no anomalous discharge occurs even if the film 12 is deposited.

Figure 6:
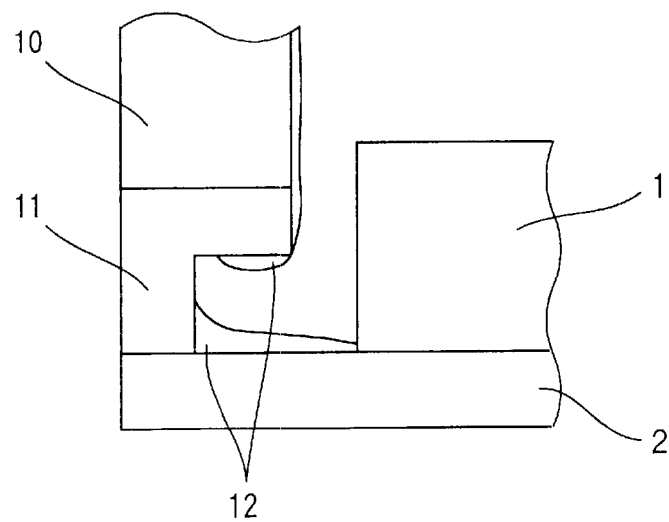
FIG. 6 is a view showing a film deposited on the target presser in the sputtering apparatus according to the present invention.
Figure 7:
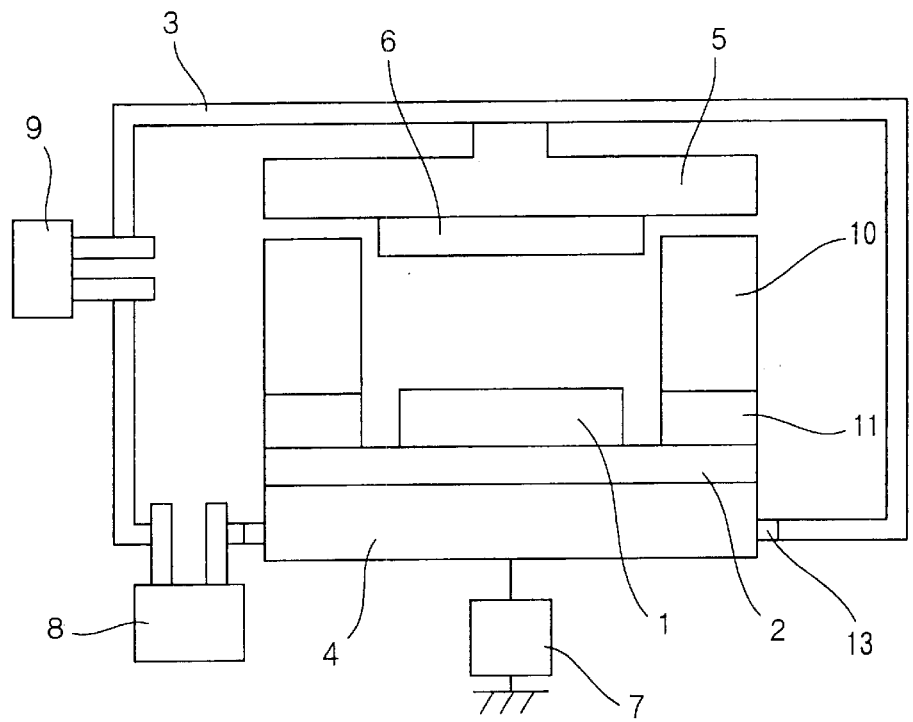
FIG. 7 is a schematic cross-sectional view showing a sputtering apparatus according to a prior art.
Figure 8:
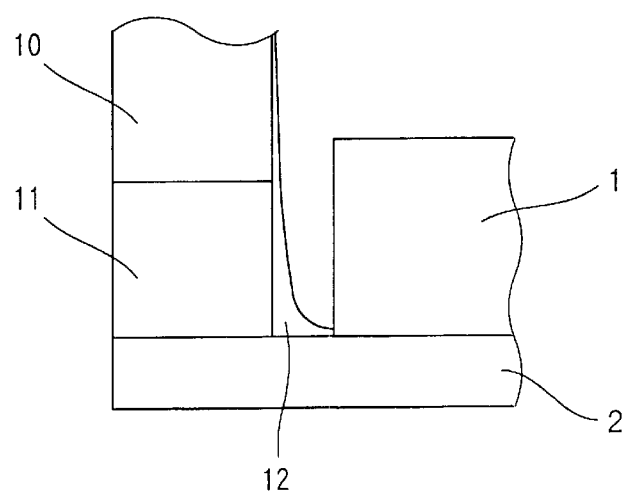
FIG. 8 is a view showing a film deposited on a target presser in the sputtering apparatus according to the prior art.
Figure 9:
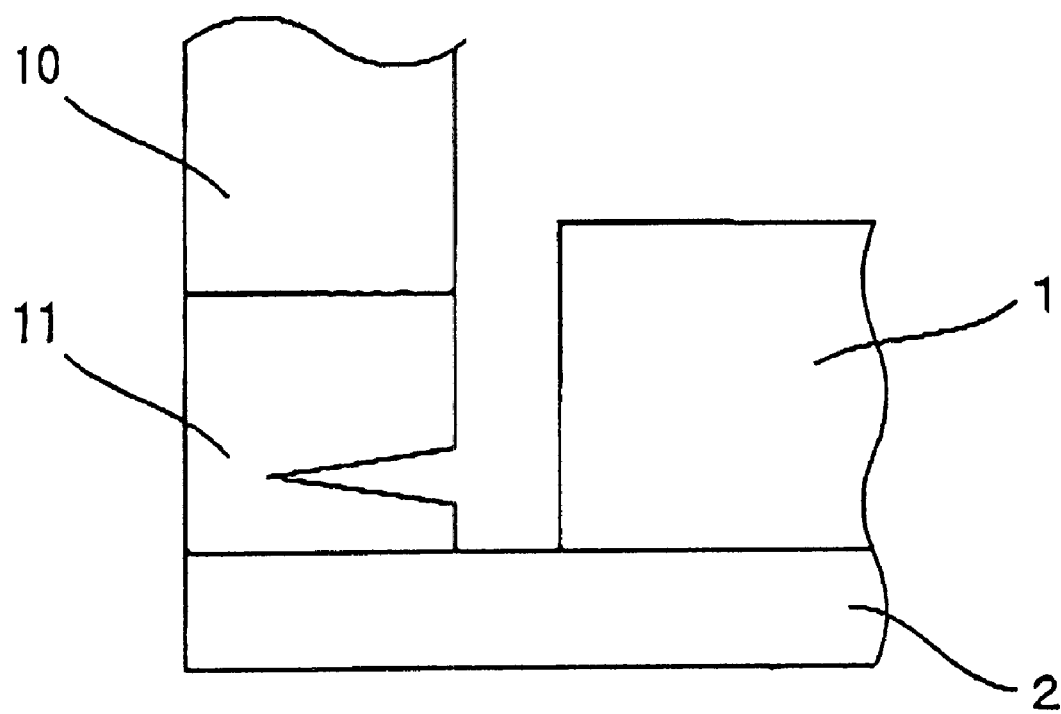
FIG. 9 is a shematic cross-sectional view showing a triangular recess.

Incidentally, insulation can be maintained also in the case where not a two-stepped recess but a recess constituted of only one step having a substantially rectangular cross section is formed, as shown in FIG. 6.

Otherwise, insulation can be maintained also in the case where a recess is formed to be not rectangle but to be triangle in cross section with the vertex of the triangle being oriented outward.

In consideration that the recess is formed in the insulating member 11 comprised of Teflon by mechanical machining, each of the two-stepped recess, the one-stepped recess and the triangular recess is formed at a portion which is in contact with the backing plate 2 in the above-described embodiment for the purpose of easy machining. However, it is understood that the recess is not restricted to the above-described portion but it may be formed at the middle portion of the insulating member.

Additionally, although the recess is formed in the insulating member of the target presser in contact with the backing plate in the present embodiment, a recess may be formed in an insulating portion of a target presser which is in contact with a target in the case of a sputtering apparatus (not shown) in which a target and a backing plate are integrated with each other.

What is claimed is:

1. A sputtering apparatus comprising:
   a reactive chamber for maintaining a vacuum therein;
   a vacuum exhaust pump for evacuating the reactive chamber to produce a pressure-reduced atmosphere therein;
   a gas supply system for supplying gas into the reactive chamber;
   a substrate holder housed in the reactive chamber, for mounting thereon a substrate to be treated with plasma;
   a cathode disposed opposite the substrate holder;
   a power source for supplying a voltage to the cathode;
   a deposition preventing plate disposed along the circumference of the substrate holder; and
   an insulating member integrally formed with the deposition preventing plate and interposed between the cathode and the deposition preventing plate, the insulating member having a target side and a recess in the target side opening toward a target, the recess having at least two different depths, wherein
   said insulating member operates as a target presser.

2. A sputtering apparatus comprising:
   a reactive chamber for maintaining a vacuum therein;
   a vacuum exhaust pump for evacuating the reactive chamber to produce a pressure-reduced atmosphere therein;
   a gas supply system for supplying gas into the reactive chamber;
   a substrate holder housed in the reactive chamber, for mounting thereon a substrate to be treated with plasma;
   a cathode disposed opposite the substrate holder;
   a power source for supplying a voltage to the cathode;
   a deposition preventing plate disposed along the circumference of the substrate holder; and
   an insulating member integrally formed with the deposition preventing plate and interposed between the cathode and the deposition preventing plate, the insulating member having a recess, the recess having at least two different depths, wherein
   said insulating member operates as a target presser.

3. The sputtering apparatus as claimed in claim 1, wherein said recess is a recess having a substantially rectangular cross section.

4. A sputtering apparatus comprising:
   a reactive chamber for maintaining a vacuum therein;
   a vacuum exhaust pump for evacuating the reactive chamber to produce a pressure-reduced atmosphere therein;
   a gas supply system for supplying gas into the reactive chamber;
   a substrate holder housed in the reactive chamber, for mounting thereon a substrate to be treated with plasma;
   a cathode disposed opposite the substrate holder;
   a power source for supplying a voltage to the cathode;
   a deposition preventing plate disposed along the circumference of the substrate holder; and
   an insulating member integrally formed with the deposition preventing plate and interposed between the cathode and the deposition preventing plate, the insulating member having a recess, the recess having a triangular cross section and, wherein
   said insulating member operates as a target presser.

5. A sputtering apparatus comprising:
   a reactive chamber for maintaining a vacuum therein;
   a vacuum exhaust pump for evacuating the reactive chamber to produce a pressure-reduced atmosphere therein;
   a gas supply system for supplying gas into the reactive chamber;
   a substrate holder housed in the reactive chamber, for mounting thereon a substrate to be treated with plasma;
   a cathode disposed opposite the substrate holder;
   a power source for supplying a voltage to the cathode;
   a deposition preventing plate disposed along the circumference of the substrate holder; and
   an insulating member integrally formed with the deposition preventing plate and interposed between the cathode and the deposition preventing plate, the insulating member having a total cross-sectional contour length larger than the height of said insulating member, said height being equal to a distance between the deposition preventing plate and a backing plate, the insulating member having a recess, the recess having at least two different depths, wherein
   said insulating member operates as a target presser.

* * * * *